(12) United States Patent
Wei et al.

(10) Patent No.: US 9,440,339 B2
(45) Date of Patent: Sep. 13, 2016

(54) ELECTRIC SCREWDRIVER (71) Applicant: CHERVON INTELLECTUAL PROPERTY LIMITED, Road Town (VG)

(72) Inventors: Gan Wei, Nanjing (CN); Wu Chen, Nanjing (CN); Shichun Tao, Nanjing (CN)

(73) Assignee: Chervon (HK) Limited, Wanchai (HK)

( * ) Notice: Subject to any disclaimer, the term of this patent is extended or adjusted under 35 U.S.C. 154(b) by 0 days.

(21) Appl. No.: 14/674,377

(22) Filed: Mar. 31, 2015

(65) Prior Publication Data

US 2016/0089771 A1   Mar. 31, 2016

(30) Foreign Application Priority Data

Sep. 30, 2014  (CN) .......................... 2014 1 0521101
Sep. 30, 2014  (CN) .......................... 2014 1 0523472
Sep. 30, 2014  (CN) .......................... 2014 1 0523473
Sep. 30, 2014  (CN) ..................... 2014 2 0576231 U (51) Int. Cl.
| | |
|---|---|
| B25B 21/00 | (2006.01) |
| B25B 23/00 | (2006.01) |
| B25F 1/00 | (2006.01) |
| B25B 23/18 | (2006.01) |
| H02G 1/12 | (2006.01) |
| B25G 1/08 | (2006.01) |
| F21V 11/16 | (2006.01) |
| F21V 33/00 | (2006.01) |
| G01R 29/24 | (2006.01) |

(52) U.S. Cl.
CPC ............. *B25B 21/002* (2013.01); *B25B 23/00* (2013.01); *B25B 23/18* (2013.01); *B25F 1/00* (2013.01); *B25G 1/085* (2013.01); *F21V 11/16* (2013.01); *F21V 33/0084* (2013.01); *G01R 29/24* (2013.01); *H02G 1/1209* (2013.01); *H02G 1/1214* (2013.01)

(58) Field of Classification Search
CPC ..... B25B 21/002; B25B 23/00; B25B 23/18; B25F 1/00; B25G 1/085; F21V 11/16; F21V 33/0084; G01R 29/24; H02G 1/1209; H02G 1/1214
See application file for complete search history.

(56) References Cited

U.S. PATENT DOCUMENTS

| | | | |
|---|---|---|---|
| 2008/0196910 A1* | 8/2008 | Radle | G01V 3/15 173/2 |
| 2015/0090471 A1* | 4/2015 | Tao | B23B 31/36 173/216 |
| 2015/0251299 A1* | 9/2015 | Fu | F21V 33/0084 362/119 |

FOREIGN PATENT DOCUMENTS

| | | |
|---|---|---|
| CN | 102990590 A | 3/2013 |
| CN | 103170943 A | 6/2013 |
| CN | 203228209 U | 10/2013 |

*Primary Examiner* — Stephen F Husar
(74) *Attorney, Agent, or Firm* — Greenberg Traurig, LLP (57) ABSTRACT

An electric screwdriver includes a motor having a motor shaft, a handle housing for accommodating the motor, an output shaft at least partly protruding from the handle housing, a transmission device for enabling the motor shaft to drive the output shaft to rotate around a first axis, an exploring antenna for detecting whether an object is charged, and an operating switch coupled to the handle housing for controlling the motor. The exploring antenna has a front end portion extending beyond the handle housing. The output shaft has an inserting groove, and a ratio of the maximum size of the handle housing to the maximum size of the inserting groove in a radial direction of the output shaft is greater than or equal to 3.9 and less than or equal to 8.

20 Claims, 11 Drawing Sheets

ELECTRIC SCREWDRIVER

This application claims the benefit of CN 201420576231.2, filed on Sep. 30, 2014, CN 201410521101.3, filed on Sep. 30, 2014, CN 201410523473. X, filed on Sep. 30, 2014, and CN 201410523472.5, filed on Sep. 30, 2014, the disclosures of which are incorporated herein by reference in their entirety.

FIELD OF THE DISCLOSURE

The present disclosure relates to electric screwdrivers, and more particularly to a multi-function electric screwdriver.

BACKGROUND OF THE DISCLOSURE

A manual screwdriver is a necessary tool for an electrician in addition to other tools such as wire strippers, needle-nose pliers, flashlights, pencils, etc. Thus, to accomplish one wiring operation, the above listed tools generally need to be changed frequently.

So far, there is no multi-function electric screwdriver which has a reasonable and reliable structure and which can accomplish the functions of the above tools.

SUMMARY

The disclosure describes an electric screwdriver, including: a motor having a motor shaft; a handle housing for accommodating the motor; an output shaft at least partly protruding forwards from the handle housing; a transmission device for enabling the motor shaft to drive the output shaft to rotate around a first axis; an exploring antenna for detecting whether an object is charged; and an operating switch capable of rotating relative to the handle housing; wherein the exploring antenna has a front end portion extending beyond the handle housing; wherein the output shaft has an inserting groove, and a ratio of the maximum size of the handle housing to the maximum size of the inserting groove in a radial direction of the output shaft is greater than or equal to 3.9 and less than or equal to 8; and wherein the operating switch at least has an operating portion, and a portion having a maximum distance between two points of the operating portion in a circumferential direction of the first axis has a radian of at least 60 degrees.

Furthermore, the operating switch may have an annular configuration surrounding the exterior of the handle housing.

Furthermore, the operating switch may rotate around the first axis relative to the handle housing.

Furthermore, the electric screwdriver may include a testing button for controlling whether the exploring antenna is energized.

Furthermore, the electric screwdriver may include an antenna shield arranged in front of the handle housing wherein the antenna shield includes a joining portion for joining the antenna shield to the handle housing and a probe portion for accommodating the exploring antenna, and the probe portion protrudes forwards from the joining portion.

Furthermore, the electric screwdriver may include a first wire stripping member fixedly mounted to the handle housing and a second wire stripping member having a wire stripping position wherein the second wire stripping member is rotatably connected to the handle housing.

The disclosure also describes an electric screwdriver, comprising: a motor having a motor shaft; a handle housing for accommodating the motor; an output shaft at least partly protruding forwards from the handle housing; a transmission device for enabling the motor shaft to drive the output shaft to rotate around a first axis; an exploring antenna for detecting whether an object is charged; and an operating switch capable of rotating relative to the handle housing; wherein the exploring antenna has a front end portion extending beyond the handle housing.

Furthermore, the operating switch may have an annular configuration surrounding the exterior of the handle housing.

Furthermore, the operating switch may rotate around the first axis relative to the handle housing.

Furthermore, the electric screwdriver may include a testing button for controlling whether the exploring antenna is energized.

Furthermore, the electric screwdriver may include an antenna shield arranged in front of the handle housing wherein the antenna shield includes a joining portion for joining the antenna shield to the handle housing and a probe portion for accommodating the exploring antenna, and the probe portion protrudes forwards from the joining portion.

Furthermore, the electric screwdriver may include an illuminating light for illuminating an area in front of the output shaft and a light shield arranged on a front end of the handle housing wherein the illuminating light is accommodated in the light shield, and the light shield includes a light shield body made of a shading material and a window body made of a transparent material and arranged corresponding to the illuminating light.

Furthermore, the light shield may be arranged between the exploring antenna and the handle housing.

Furthermore, the electric screwdriver may include a first wire stripping member fixedly mounted to the handle housing and a second wire stripping member having a wire stripping position wherein the second wire stripping member is rotatably connected to the handle housing.

The disclosure also describes an electric screwdriver, comprising: a motor having a motor shaft; a handle housing for at least accommodating the motor; an output shaft at least partly protruding forwards from the handle housing; a transmission device for enabling the motor shaft to drive the output shaft to rotate around a first axis; an exploring antenna for detecting whether an object is charged; and an operating switch capable of rotating relative to the handle housing; wherein the output shaft has an inserting groove, and a ratio of the maximum size of the handle housing to the maximum size of the inserting groove in a radial direction of the output shaft is greater than or equal to 3.9 and less than or equal to 8.

Furthermore, the operating switch may have an annular configuration surrounding the exterior of the handle housing.

Furthermore, the operating switch may rotate around the first axis relative to the handle housing.

Furthermore, the electric screwdriver may include a testing button for controlling whether the exploring antenna is energized.

Furthermore, the electric screwdriver may include an antenna shield arranged in front of the handle housing wherein the antenna shield includes a joining portion for joining the antenna shield to the handle housing and a probe portion for accommodating the exploring antenna.

Furthermore, the joining portion may surround the output shaft and the probe portion may protrude from the joining portion in an axial direction of the output shaft.

The statements in this section merely provide background information related to the present disclosure and may not constitute prior art.

The drawings described herein are for illustrative purposes only of exemplary embodiments and not all possible implementations, and are not intended to limit the scope of the present disclosure. Corresponding reference numerals indicate corresponding parts throughout the several views of the drawings.

DETAILED DESCRIPTION

The following description of the preferred embodiments is merely exemplary in nature and is in no way intended to limit the scope of the claimed invention, its application, or uses.

An electric screwdriver 100 as shown in FIGS. 1-4 may include a handle housing 11, a power source 12, a motor 13, a transmission device 14, an output shaft 15, a circuit assembly 16, and an operating switch 17. To explain the technical solution of the present disclosure simply, some terms are defined as follows: a rotating axis of the output shaft 15 is defined as a first axis M, a direction of the first axis M and a direction parallel to the first axis M are defined as an axial direction, a peripheral direction surrounding the axial direction is defined as a circumferential direction, and a direction perpendicular to the axial direction and intersecting the first axis M is defined as a radial direction.

The handle housing 11 accommodates the motor and includes a front end for installing the output shaft 15 and a rear end distal from the output shaft 15. The handle housing 11 is used to form a handle for gripping, and to form an accommodating cavity for accommodating the power source 12, the motor 13 and the transmission device 14. Specifically, the handle housing 11 has a substantially linear shape, and includes a first housing 111 and a second housing 112 connected as one piece through screws. The handle housing 11 partly accommodates the output shaft 15 of which one end is in the front end of the handle housing 11 and the other end protrudes out from the handle housing 11. The end of the output shaft 15 protruding out from the handle housing 11 is provided with an inserting groove 151. The inserting groove 151 is used to connect with members such as screwdriver bits, screws, and so on.

Figure 3:
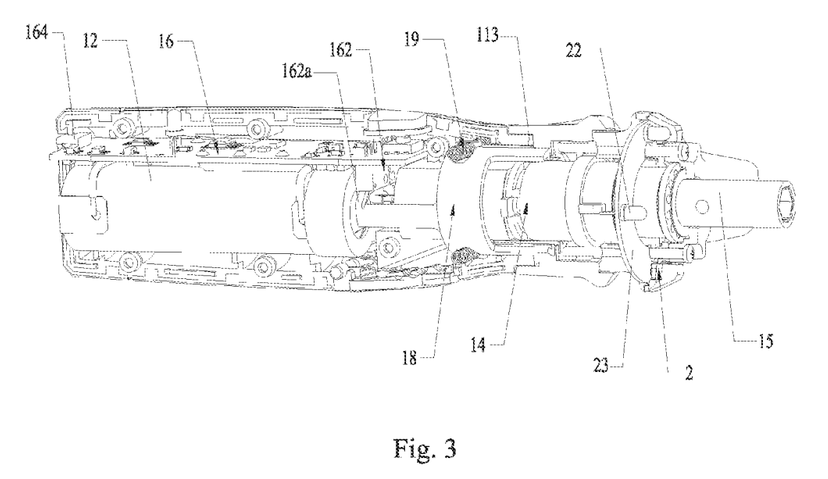
FIG. 3 is a schematic perspective view showing the interior structure of the electric screwdriver of FIG. 1.
Figure 4:
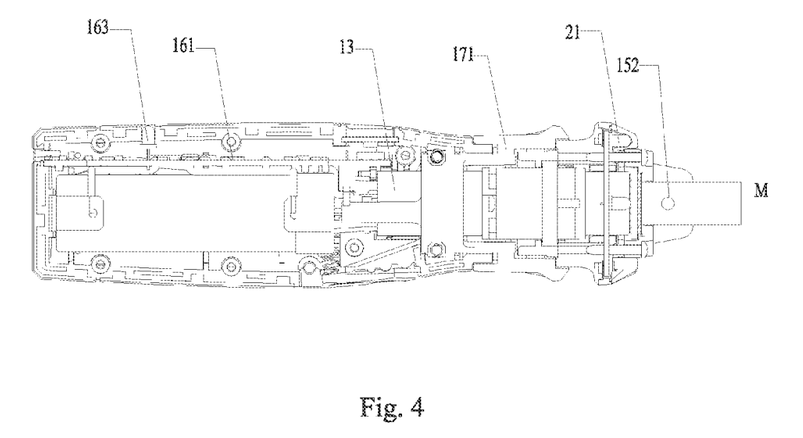
FIG. 4 is a schematic plan view showing the interior structure of the electric screwdriver of FIG. 1.

The motor 13 has a motor shaft and the transmission device 14 is used for enabling the motor shaft to drive the output shaft 15 to rotate around a first axis M. The transmission device 14 is a gearbox for achieving the conversion between the rotating speed and the torque. The transmission device 14 has a shaft lock in the interior thereof. The shaft lock enables the torque to be only transmitted from the motor 13 to the output shaft 15, and when the torque is reversely transmitted at the output shaft 15, the output shaft 15 is locked with the gearbox. The user can use the electric screwdriver as a manual screwdriver when the output shaft 15 is locked by the shaft lock.

Preferably, the inserting groove 151 has a standard inner hexagon hole with a circumscribed circle having a diameter of 6.5 mm, and the handle housing 11 has a maximum size of 50 mm in the radial direction of the output shaft 15.

During use, to facilitate the operation by a user, it is desired that the handle housing 11 is easy to be gripped, thus the size of the handle housing 11 is controlled to be as small as possible, especially the size in the radial direction of the output shaft 15, which obviously affects the gripping comfort.

On the other hand, when the electric screwdriver 100 is used as a common manual screwdriver, it is desired to obtain a relatively large torque by using a force as small as possible at the screwdriver bit. In accordance with the lever principle, in the radial direction of the output shaft 15, the larger the handle housing 11 is, the smaller the inserting groove 151 is, and the smaller force the user needs. Generally, considering the strength of the structure, the size of the inserting groove 151 in the radial direction should not be too small. To mate with standard bits, the size of the inserting groove 151 is generally constant, and thus the handle housing 11 should not be too small.

In order to resolve the above contradiction, the present disclosure comprehensively considers a series of sizes of the inner hexagon holes of the standard bits, the palm size of the user, and the friction force which is comfortably accepted by the palm during the rotation by the user, it has been determined by experimentation that, if the ratio of the maximum size of the handle housing 11 to the maximum size of the inserting groove 151 in the radial direction of the output shaft 15 is greater than or equal to 3.9 and less than or equal to 8, the screwdriver will be easy to grip and simple to rotate manually by the user.

Preferably, the transmission ratio between the rotating motor shaft of the motor 13 and the output shaft 15 is greater than or equal to 50 and less than or equal to 100, that is to say, the transmission ratio provided by the transmission device 14 is greater than or equal to 50 and less than or equal to 100. As a further preferred solution, the transmission ratio is between 90 and 100.

With the above transmission ratio, the user can obtain good operating feeling.

The power source 12 is used to supply power to the motor 13. The power source 12 is arranged in the handle housing 11 and includes at least one battery. Preferably, the battery is a lithium battery. The lithium battery may be a primary battery or a rechargeable battery. As for the rechargeable battery, a charging indicator light 163 is provided to indicate the charging state. When the rechargeable battery is charged, the charging indicator light 163 is on; when the rechargeable battery is in the charging state, the charging indicator light 163 is red; and when the rechargeable battery is fully charged, the charging indicator light 163 is green.

The motor 13 is connected to the transmission device 14. The transmission device 14 is driven by the motor 13 so as to further drive the output shaft 15 to rotate around the first axis M. In order to enable the radial size of the handle housing 11 to be as small as possible, the motor 13 may be a micro motor having a relatively large output torque.

The circuit assembly 16 is used to control whether the power source 12 supplies power to the motor 13. The circuit assembly 16 includes a controlling circuit board 161 and a rod switch 162. The controlling circuit board 161 is provided with a power supply circuit for enabling the power source 12 to supply power to the motor 13. The controlling circuit board 161 is further provided with a charging indicator light 163 and a charging interface 164. The charging indicator light 163 is the above indicator light for indicating the charging state of the rechargeable battery. The charging indicator light 163 is fixed on the controlling circuit board 161, and the handle housing 11 is provided with a visible window through which the user can observe the state of the charging indicator light 163. The charging interface 164 is used to charge the rechargeable battery in the above power source 12 and is also fixed on the controlling circuit board 161, and the handle housing 11 is further provided with a charging groove for accommodating and fixing the charging interface 164. Preferably, the charging interface 164 may be a USB charging interface 164, thereby adapting to various chargers.

The rod switch 162 is fixedly arranged in the handle housing 11 and is used to switch on or switch off the power supply circuit so as to control whether the power source 12 outputs power to the motor 13. The rod switch 162 is provided with an operating rod 162a capable of being operated. With the triggering and restoring of the operating rod 162a, the rod switch 162 may be switched on or switched off.

The operating switch 17 can control the controlling circuit assembly 16 so as to control the operation of the motor 13 by its action. The operating switch 17 has an operating portion, and a portion having a maximum distance between two points of the operating portion in a circumferential direction of the first axis has a radian of at least 60 degrees. Specifically, the operating switch 17 has an annular configuration surrounding and sleeved on the outer surface of the handle housing 11, and forming a rotating connection with the handle housing 11 about the first axis M. Preferably, in order to control the controlling circuit assembly 16 to enable the power source 12 to supply power to the motor 13 when the operating switch 17 rotates around the handle housing 11, the handle housing 11 is further provided with a fork member 18 in the interior thereof. The fork member 18 may be integrated with the operating switch 17 or separated from the operating switch 17.

In the present embodiment, the operating switch 17 is separated from the fork member 18 for instance, and thereby they can be removed easily.

Figure 7:
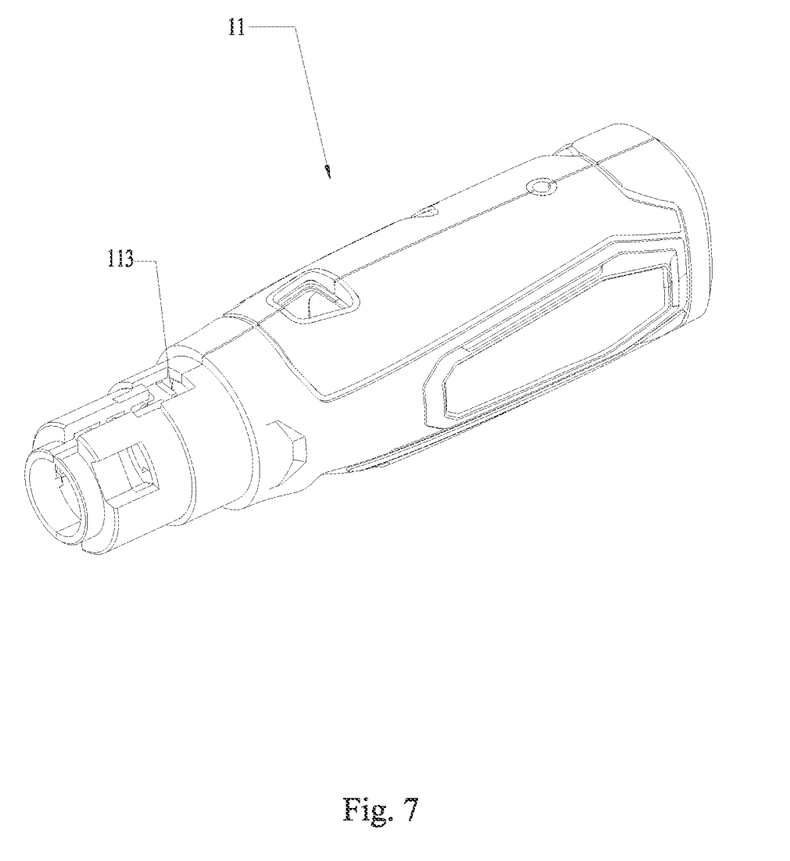
FIG. 7 is a structural schematic view showing the handle housing of the electric screwdriver of FIG. 1.

In order to enable the fork member 18 to trigger the operating rod 162a of the rod switch 162 when the operating switch 17 rotates around the handle housing, the operating switch 17 is provided with a block 171 in the interior thereof. The block 171 forces the fork member 18 to rotate with the operating switch 17 synchronously. Specifically, as shown in FIG. 7, the block 171 projects inwardly and radially in the interior of the operating switch 17, and the handle housing 11 is correspondingly provided with a hole 113 through which the block 171 passes, so that the block 171 can extend into the handle housing 11 to contact the fork member 18 from the operating switch 17 outside of the handle housing 11.

Figure 1:
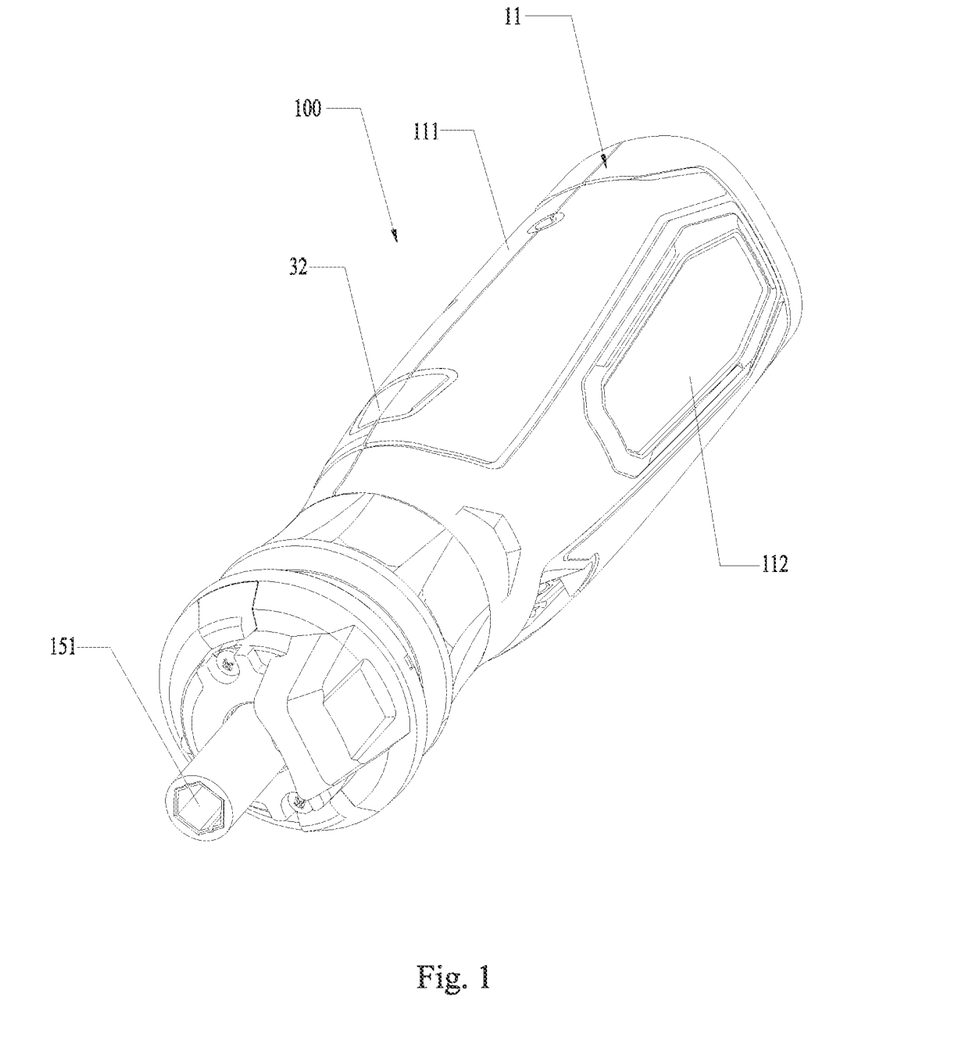
FIG. 1 is a structural schematic view of an electric screwdriver of the present disclosure.
Figure 2:
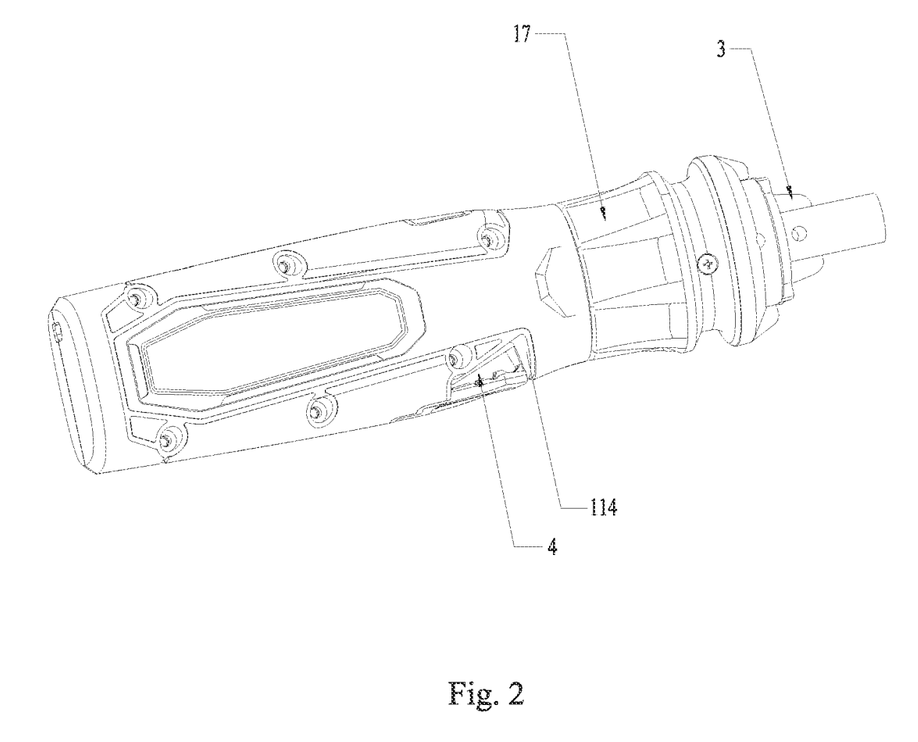
FIG. 2 is another structural schematic view of the electric screwdriver of FIG. 1 taken from another angle.
Figure 5:
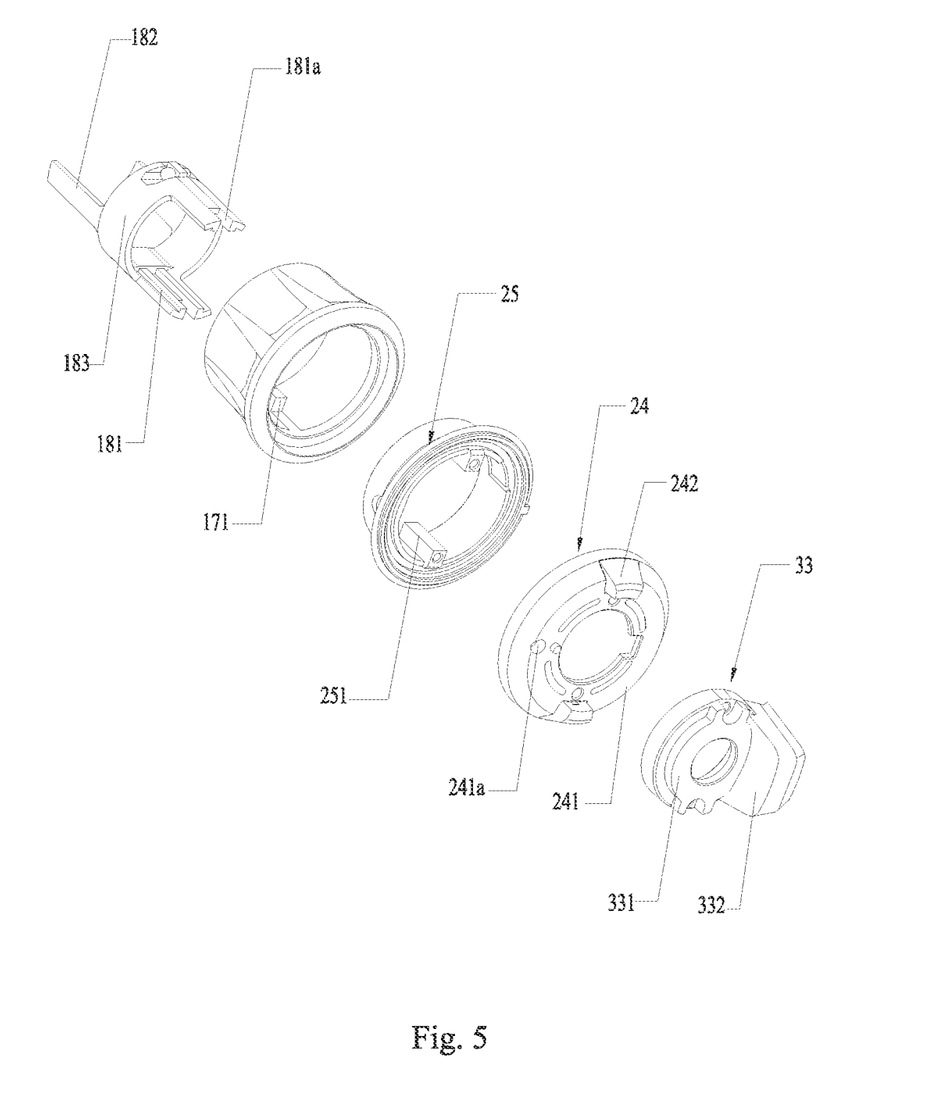
FIG. 5 is an exploded view showing the structure of a part of the electric screwdriver of FIG. 1.

As shown in FIGS. 1 and 5, the fork member 18 includes a jaw portion 181, a leg portion 182 and a connecting portion 183. The jaw portion 181 is used to cooperate with the block 171 of the operating switch 17. The jaw portion 181 is further provided with a groove 181a in which the block 171 is embedded. The groove 181a extends in a direction parallel to the axial direction so that when the block 171 rotates with the operating switch 17 around the first axis M, the fork member 18 can rotate with the operating switch 17 synchronously under cooperation with the jaw portion 181. The connecting portion 183 is used to connect the jaw portion 181 and the leg portion 182. The connecting portion 183 is sleeved on the motor 13 so as to support the fork member 18. The leg portion 182 extends from the connecting portion 183 in the axial direction. Moreover, the leg portion 182 and the jaw portion 181 are arranged on two opposite sides of the connection portion 183 in the axial direction. The leg portion 182 extends to contact the operating rod 162a of the rod switch 162 in the circuit assembly 16. As such, when the fork member 18 is forced by the operating switch 17 to rotate around the first axis M, the leg portion 182 can trigger the operating rod 162a so that the rod switch 162 is switched on, thus the power supply circuit is switched on and the power source 12 can supply power to the motor 13 to drive the output shaft 15 to rotate.

In order to automatically shut off the power supply between the power source 12 and the motor 13 when the user releases the operating switch 17, the electric screwdriver 100 further includes a first biasing member 19 for biasing the fork member 18 to restore it to the restoring position automatically. When the fork member 18 is in the restoring position, the leg portion 182 is disengaged from the operating rod 162a and the rod switch 162 shuts off the power supply circuit, thus the circuit assembly 16 shuts off the power supply between the power source 12 and the motor 13 and the output shaft 15 stops rotating. The first biasing member 19 includes four spiral springs. One end of each spiral spring is fixed on the connecting portion 183 and the other end abuts against the handle housing 11. When the operating switch 17 is released, the compressed spiral springs bias the fork member 18 to restore to the restoring position under the action of the spring force. Meanwhile, the operating switch 17 is restored to the initial position under the cooperation between the jaw portion 181 of the fork member 18 and the block 171 of the operating switch 17.

The electric screwdriver 100 further includes an illuminating assembly 2, a testing assembly 3, a wire stripping assembly 4, and the illuminating assembly 2, the testing assembly 3 and the wire stripping assembly 4 are additional functional members integrated with the electric screwdriver 100 for achieving various functions, thereby providing a machine that serves several purposes.

The following will describe the additional functions integrated with the electric screwdriver 100 of the present disclosure.

As shown in FIGS. 3 and 5, the illuminating assembly 2 is arranged on the front end surface outside the handle housing 11 and separated from the handle housing 11. The illuminating assembly 2 is used for illumination and generates signals to be recognized by the eyes. Specifically, the illuminating assembly 2 includes an illuminating light 21 for illuminating an area in front of the output shaft 15, a functioning light 22, an illuminating circuit board 23, a light shield 24 and a fixing bracket 25. The illuminating light 21 is used for illumination when the electric screwdriver 100 is operated in a dark area and the functioning light 22 serves as an indicator light when the testing assembly 3 works. Both the illuminating light 21 and the functioning light 22 are fixed on the illuminating circuit board 23 which has an annular configuration. The light shield 24 is used to enclose the illuminating circuit board 23 and is arranged on the front end of the handle housing 11. The light shield 24 also has an annular configuration and includes a light shield body 241 and a window body 242. The light shield body 241 is made of a shading material, and the window body 242 is made of a transparent material. The illuminating light 21 is arranged in the light shield 24, and the window body 242 is arranged in the light shield body 241 at a position corresponding to the illuminating light 21. The light shield body 241 is further provided with a through hole 241a. The functioning light 22 projects out from the light shield body 241 through the through hole 241a to provide a visible signal. The fixing bracket 25 is fixed on one end of the handle housing 11 for mounting the illuminating assembly 2 on the exterior of the handle housing 11. The fixing bracket 25 has an annular configuration and is provided with a pair of mounting walls 251 in the interior thereof. The illuminating circuit board 23 and light shield 24 are fixed on the fixing bracket 25 by screws passing through the light shield body 241 and the illuminating circuit board 23 and extending to the mounting walls 251.

The illuminating circuit board 23 is provided with an illuminating circuit for controlling the illuminating light 21. Under the control of the illuminating circuit, the illuminating light 21 has synchronous power-on and delay power-off functions, that is to say, when the operating switch 17 is switched on, the illuminating light 21 is on, and when the operating switch 17 is switched off, the illuminating light 21 is remain on for a while and then off. Preferably, the illuminating light 21 remains on for 10 seconds to 60 seconds and then turns off. As a result, when the working area is relatively dark and the screws are invisible, the operating switch 17 may be switched on for a while and then switched off, thus the operating position may be determined previously before the operation starts.

Figure 6:
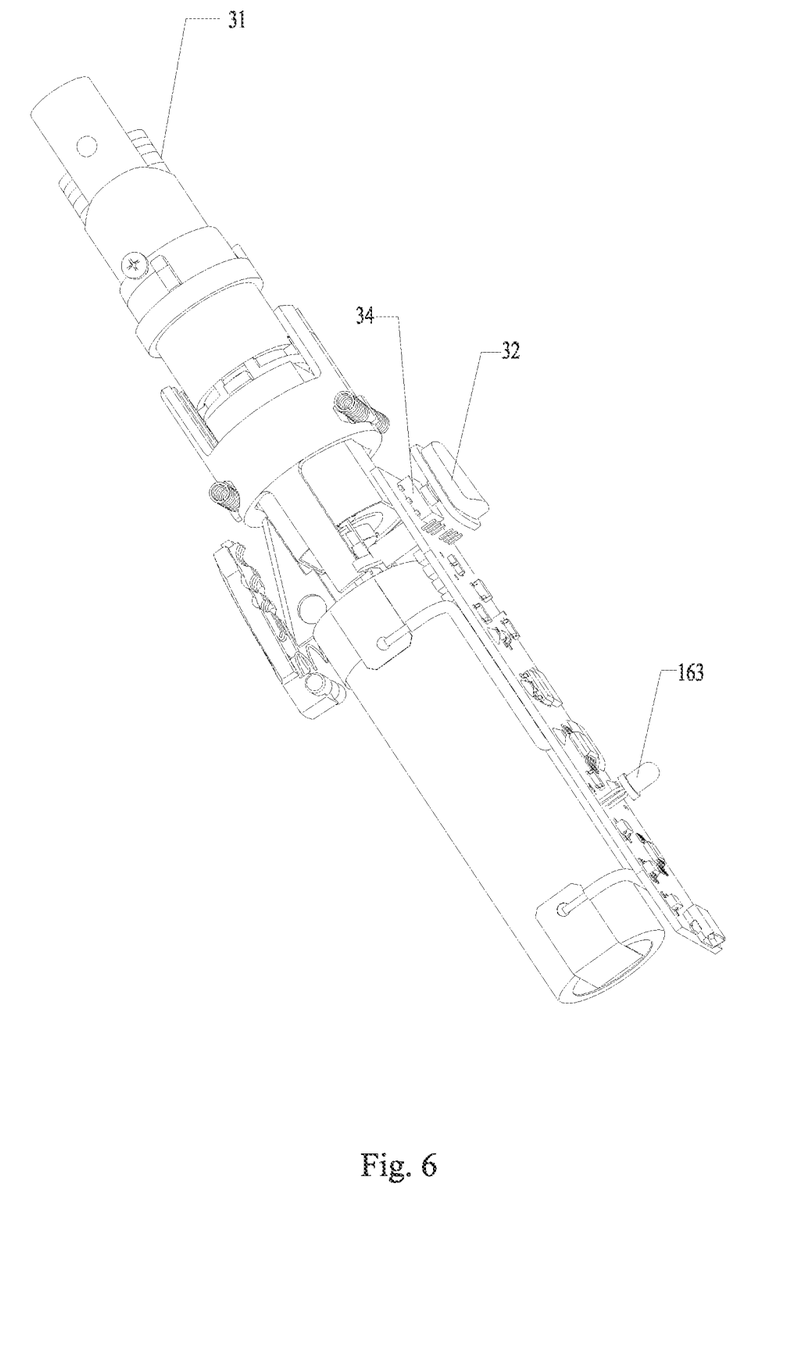
FIG. 6 is a structural schematic view of the electric screwdriver of FIG. 1, wherein a handle housing, an illuminating assembly and an antenna shield are removed.

As shown in FIGS. 5 and 6, the testing assembly 3 is used to detect whether an object is electrically charged. The testing assembly 3 includes an exploring antenna 31 for detecting whether an object is charged, a testing button 32 and an antenna shield 33. The exploring antenna 31 is separately arranged on the exterior of the handle housing 11 and has a front end portion extending beyond the handle housing 11. The exploring antenna 31 and the handle housing 11 are arranged on two opposite sides of the light shield 24. The exploring antenna 31 includes a winded coil. When the exploring antenna 31 moves close to a charged object, a magnet field is formed in the coil, thereby sending a signal to indicate that the object is charged. Preferably, the testing assembly 3 includes an indicating device for indicating that the structure is charged. The indicating device may be a buzzer or the functioning light 22 or both. In this embodiment, the indicating device includes a buzzer and a functioning light for example, wherein the buzzer is arranged in the handle housing 11 and the functioning light 22 is positioned in the illuminating assembly 2. The testing button 32 is to be pressed to control whether the exploring antenna 31 is energized by the user upon testing, and the testing button 32 is arranged on the handle housing 11, thereby facilitating the operation.

The antenna shield 33 is arranged in front of the handle housing 11 and further in front of the light shield 24. The antenna shield 33 includes a joining portion 331 and a probe portion 332.

The joining portion 331 is used to join the antenna shield 33 with the handle housing 11, and the probe portion 332 is used to accommodate the exploring antenna 31. The probe portion 332 protrudes forwards from the joining portion 331.

The joining portion 331 surrounds the output shaft 15 and is installed with the light shield 24 and the illuminating circuit board 23 through screws. The probe portion 332 is used to accommodate the exploring antenna 31. The probe portion 332 projects from the joining portion 331 and extends forward in the axial direction of the output shaft 15, and thereby can approach the object to be tested more easily without affecting the rotation of the output shaft 15. Preferably, the light shield 24 also projects from the antenna shield 33 and the handle housing 11 in the radial direction of the output shaft 15. That is to say, the radial maximum size of the light shield 24 is greater than the radial maximum sizes of the antenna shield 33 and the handle housing 11, thus the illuminating light 21 can illuminate a larger area, and may not be affected by the antenna shield 33 and the handle housing 11 as much as possible.

The controlling circuit board 161 is further provided with a testing switch 34. The testing switch 34 is arranged in correspondence with the testing button 32 and contacts the testing button 32. When the testing button 32 is pressed, the testing switch 34 enables the testing assembly 3 to switch on so as to start the testing operation.

In order to further ensure the accuracy of the testing, the testing assembly is further provided with a self-checking circuit for checking the integrity of the testing assembly 3. Under the action of the self-checking circuit, when the testing button 32 is triggered, if the testing assembly 3 is in good condition, the buzzer beeps, and the functioning light 22 flashes; otherwise, the buzzer does not beep, and the functioning light 22 does not flash to indicate that the testing device is damaged. As such, after the testing assembly 3 is determined to be in good condition, the exploring antenna 31 is moved close to the object to be tested and the testing button 32 is pressed, if the object to be tested has an electrical signal, the buzzer will beep continuously, and the functioning light 22 flashes continuously.

Figure 8:
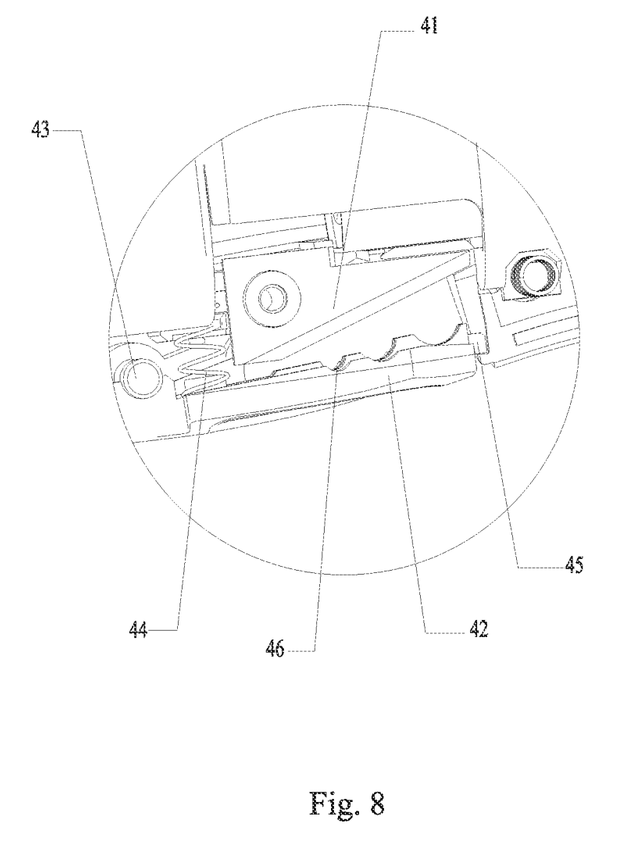
FIG. 8 is an enlarged schematic view showing a wire stripping assembly of the electric screwdriver of FIG. 1.

As shown in FIG. 8, the wire stripping assembly 4 is integrated on the outside of the handle housing 11, and the side of the handle housing 11 is concaved inwards to form a wire stripping groove 114 for accommodating the wire stripping assembly 4. The wire stripping assembly 4 includes a first wire stripping member and a second wire stripping member. The first wire stripping member is a first blade 41 fixedly installed in the wire stripping groove 114 of the handle housing 11. The first blade 41 has an edge partly protruding from the handle housing 11 and perpendicular to the length direction of the handle housing 11. Preferably, the second wire stripping member is a wire stripping button 42 with a blade or without a blade. In this embodiment, the wire stripping button 42 does not have a blade for example. The wire stripping button 42 can move close to or away from the first blade 41. Preferably, the wire stripping button 42 is arranged outside of the first blade 41 and forms a rotating connection with the handle housing 11. One end of the wire stripping button 42 is mounted to the handle housing 11 through a rotating shaft 43, and the other end is a free end.

The direction of the rotating shaft 43 is perpendicular to the length direction of the handle housing 11. The end of the wire stripping button 42 connected to the rotating shaft 43 is provided with a restoring spring 44 which abuts against the wire stripping button 42 to enable the wire stripping button 42 to automatically restore to the initial position. The free end is further provided with a stopping projection 45 which is embedded into the handle housing 11 in order to prevent the free end of the wire stripping button 42 from moving away from the handle housing 11 and thereby keeping the wire stripping button 42 in the initial position when the wire stripping button 42 is not triggered. Preferably, the side of the wire stripping button 42 facing to the first blade 41 is further provided with a plurality of arc wire stripping grooves 46 having different radii, thus the wire stripping assembly 4 can not only lock the wire to be stripped so as to prevent the wire from sliding leftwards and rightwards, but also can strip various wires having different radii. In the present embodiment, the wire stripping button 42 is arranged on the side of the handle housing 11 and positioned in a position adjacent to the front part of the handle housing 11. As such, the user can press the wire stripping button 42 while gripping the handle housing 11 by one hand to obtain one hand operation, and pull and strip the wires by the other hand to obtain a simple operation.

The exploring antenna 31 is further arranged between the second wire stripping member and the testing button 32, thus when the handle housing 11 is gripped, the exploring antenna 31 can contact the object to be tested easily once the testing button 32 is triggered. Meanwhile, if the object is a wire to be stripped, the stripping operation may be performed subsequently when the wire is detected to be not charged.

In the circumferential direction of the output shaft 15, the circumferential positions of the exploring antenna 31 and the functioning light 22 are symmetrical relative to the direction of the first axis M of the output shaft 15. Meanwhile, the testing button 32 is arranged between the exploring antenna 31 and the functioning light 22. In the axial direction of the output shaft 15, the operating switch 17 is positioned between the exploring antenna 31 and the testing button 32. As such, when the handle housing 11 of the electric screwdriver 100 is gripped so that the exploring antenna 31 is moved close to the object to be tested, the testing button 32 is pressed and the functioning light 22 sends a signal according to the detected structures. At that moment, the functioning light 22 can be directly observed by the user without rotating the electric screwdriver 100.

The portion of the output shaft 15 protruding out from the handle housing 11 is provided with a bending hole 152. The bending hole 152 is a revolving hole having an axis perpendicular to the first axis M. As such, when the output shaft 15 rotates around the first axis M, the inner core of the wire inserted in the bending hole 152 will be bent automatically.

Figure 9:
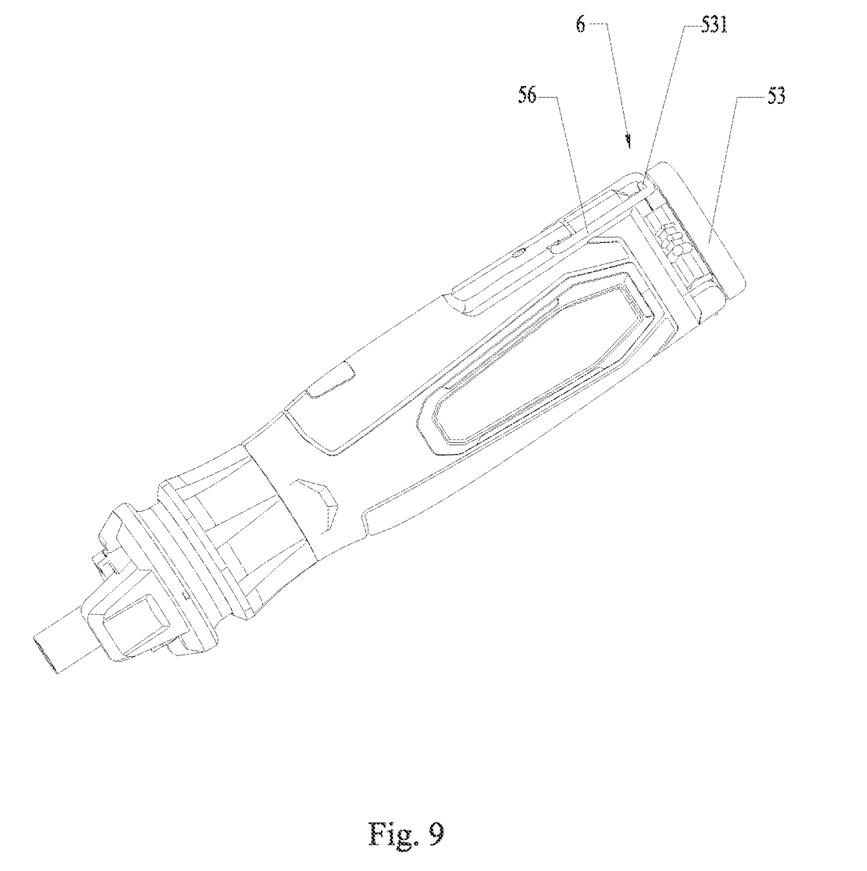
FIG. 9 is a structural schematic view showing a preferred embodiment of the wire stripping assembly of the electric screwdriver of FIG. 1.
Figure 10:
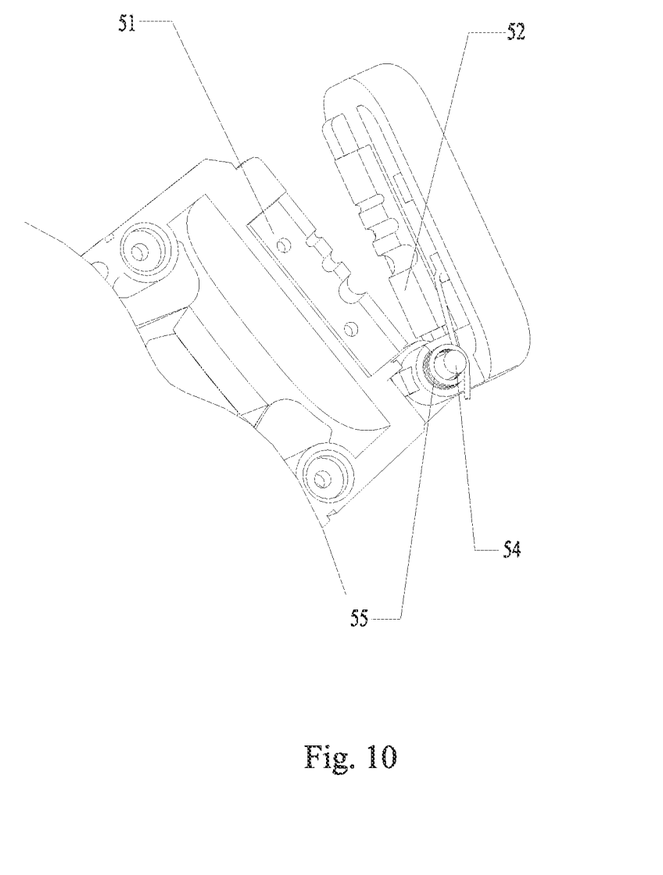
FIG. 10 is an enlarged schematic view of the wire stripping assembly of FIG. 9.

As a preferred solution of the wire stripping assembly 4 in this embodiment, a wire stripping assembly 5 may also be arranged on the rear end surface of the handle housing 11 away from the output shaft 15, as shown in FIGS. 9-10. The wire stripping assembly 5 includes a first wire stripping member fixed on the rear end surface of the handle housing 11 and a second wire stripping member rotatable relative to the handle housing 11. The first wire stripping member is a first blade 51, and the second wire stripping member includes a second blade 52 having a wire stripping position and a wire stripping button 53. The length directions of the first blade 51 and the second blade 52 are perpendicular to the length direction of the handle housing 11, and the second blade 52 is fixedly mounted on the wire stripping button 53. The wire stripping button 53 is rotatably connected to the rear end surface of the handle housing 11 through a rotating shaft 54. The axis direction of the rotating shaft 54 is perpendicular to the output shaft 15, and the rotating shaft 54 is further sleeved with a second bias member 55 for biasing the wire stripping button 53 to move away from the first blade 51 to a preset position. The second bias member 55 is a torsional spring with an end abutting against the wire stripping button 53 so that the second blade 52 and the first blade 51 are in an opened condition. The wire stripping assembly 5 further includes a stopping member 56 having a generally rectangle structure. One end of the stopping member 56 is rotatably connected to the side of the handle housing 11, and the other end can mate with a stopping projection 531 of the wire stripping button 53, thus when the wire stripping assembly 5 is not used, the wire stripping button 53 can overcome the torque caused by the torque spring and be positioned in a relatively closed state relative to the first blade 51, which can not only prevent the user from being damaged by the wire stripping assembly 5, but also extend the working life of the wire stripping assembly 5. It may be appreciated that on the wire stripping assembly 5, the first blade 51 and the second blade 52 may also be correspondingly provided with various semicircle structures having different radii.

Figure 11:
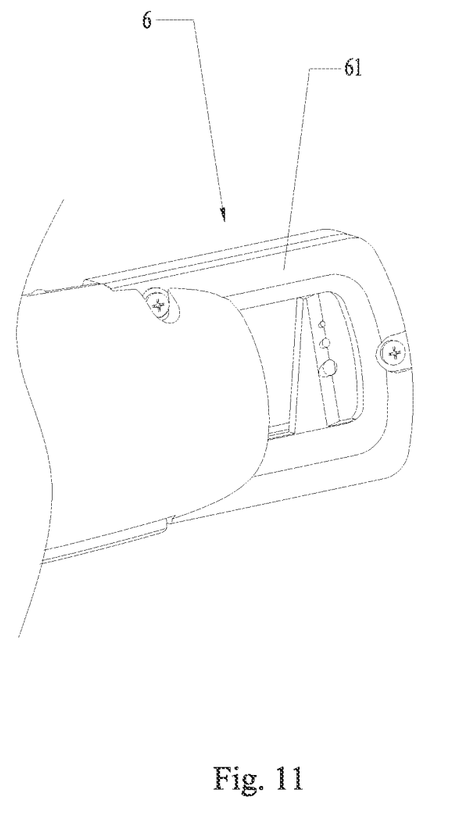
FIG. 11 is a structural schematic view showing another preferred embodiment of the wire stripping assembly of the electric screwdriver of FIG. 1.
Figure 12:
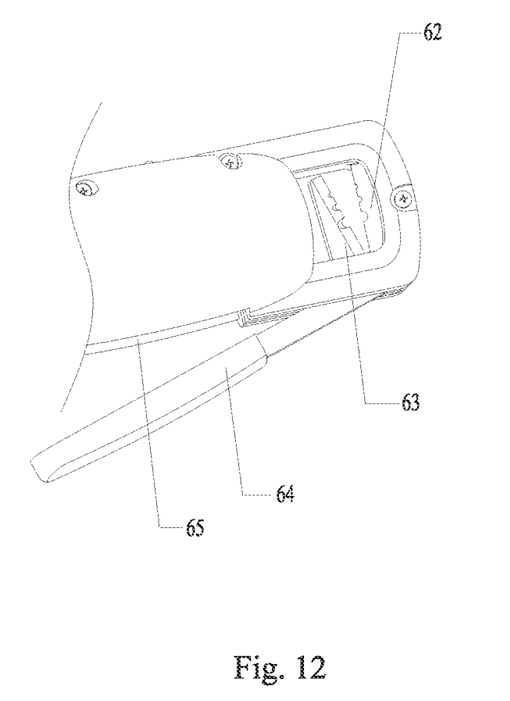
FIG. 12 is an enlarged schematic view of the wire stripping assembly of FIG. 11.

As another preferred solution of the wire stripping assembly 4 in this embodiment, a wire stripping assembly 6 may also be arranged on a fixing frame 61 extended from or connected to the rear end of the handle housing 11, as shown in FIGS. 11-12. The fixing frame 61 has a generally U-shaped structure with an opening connected to the handle housing 11. It may be appreciated that the fixing frame 61 may also be integrated with the handle housing 11. The wire stripping assembly 6 includes a first wire stripping member and a second wire stripping member. The first wire stripping member includes a first blade 62, and the second wire stripping member includes a second blade 63 and a trigger 64. The first blade 62 is fixedly mounted to the inner side of the closed end of the U-shaped structure of the fixing frame 61. The inner side refers to the side of the closed end of the fixing frame 61 adjacent to the handle housing 11, thereby achieving a protection. The first blade 62 also extends in a direction perpendicular to the first axis M. The second blade 63 and the first blade 62 cooperate with each other. The second blade 63 is mounted on the trigger 64 and has an angle between 60 and 120 degrees relative to the trigger 64, preferably, 90 degrees. It may be appreciated that the second blade 63 may also be integrated with the trigger 64. The second blade 63 is positioned in the fixing frame 61, and the trigger 64 is positioned outside of the fixing frame 61. The cooperation provided by the trigger 64 and the second blade 63 forms a rotating connection with the fixing frame 61 perpendicular to the first axis M, and the trigger 64 controls the second blade 63 to be opened or closed relative to the first blade 62 during the rotation. In this embodiment, the edges of the first blade 62 and the second blade 63 are arranged oppositely and separated from each other so as to form a structure like a scissor, thereby obtaining a good cutting effect. It may be appreciated that on the wire stripping assembly 6, the first blade 62 and the second blade 63 may also be correspondingly provided with various semicircle structures having different radii. Preferably, the side of the handle housing 11 is concaved inwards to form a receiving groove 65 for receiving the trigger 64, thus when the wire stripping assembly 6 is not used, the trigger 64 may be embedded in the receiving groove 65 and therefore the handle housing 11 may be gripped more comfortably.

The above illustrates and describes basic principles, main features and advantages of the present invention. Those skilled in the art should appreciate that the above embodiments do not limit the present invention in any form. Technical solutions obtained by equivalent substitution or equivalent variations all fall within the scope of the present invention.

What is claimed is:

1. An electric screwdriver, comprising:
a motor having a motor shaft;
a handle housing for accommodating the motor;
an output shaft at least partly protruding from the handle housing, the output shaft defining an inserting groove, and a ratio of the maximum size of the handle housing to the maximum size of the inserting groove in a radial direction of the output shaft is greater than or equal to 3.9 and less than or equal to 8;
a transmission device for enabling the motor shaft to drive the output shaft to rotate around a first axis;
an exploring antenna for detecting whether an object is electrically charged, the exploring antenna comprising a front end portion extending beyond the handle housing; and
an operating switch coupled to the handle housing for controlling operation of the motor, the operating switch having an operating portion, and a portion of the operating portion having a maximum distance between two points in a circumferential direction of the first axis has a radian of at least 60 degrees.

2. The electric screwdriver according to claim 1, wherein the operating switch has a substantially annular configuration surrounding the exterior of the handle housing.

3. The electric screwdriver according to claim 1, wherein the operating switch is arranged to rotate around the first axis relative to the handle housing.

4. The electric screwdriver according to claim 1, further comprising a testing button for controlling whether the exploring antenna is energized.

5. The electric screwdriver according to claim 1, further comprising an antenna shield arranged in front of the handle housing wherein the antenna shield comprises a joining portion for joining the antenna shield to the handle housing and a probe portion for accommodating the exploring antenna, and the probe portion protrudes forwards from the joining portion.

6. The electric screwdriver according to claim 1, further comprising a first wire stripping member fixedly mounted to the handle housing and a second wire stripping member having a wire stripping position wherein the second wire stripping member is rotatably connected to the handle housing.

7. An electric screwdriver, comprising:
a motor having a motor shaft;
a handle housing for accommodating the motor;
an output shaft at least partly protruding from the handle housing;
a transmission device for enabling the motor shaft to drive the output shaft to rotate around a first axis;
an exploring antenna for detecting whether an object is electrically charged, the exploring antenna including a front end portion extending beyond the handle housing; and
an operating switch for controlling operation of the motor and arranged for rotation relative to the handle housing.

8. The electric screwdriver according to claim 7, wherein the operating switch has an annular configuration surrounding the exterior of the handle housing.

9. The electric screwdriver according to claim 7, wherein the operating switch is arranged for rotation around the first axis relative to the handle housing.

10. The electric screwdriver according to claim 7, further comprising a testing button for controlling whether the exploring antenna is energized.

11. The electric screwdriver according to claim 7, further comprising an antenna shield arranged in front of the handle housing wherein the antenna shield comprises a joining portion for joining the antenna shield to the handle housing and a probe portion for accommodating the exploring antenna, and the probe portion protrudes forwards from the joining portion.

12. The electric screwdriver according to claim 7, further comprising an illuminating light for illuminating an area in front of the output shaft and a light shield arranged on a front end of the handle housing wherein the illuminating light is accommodated in the light shield, and the light shield comprises a light shield body made of a shading material and a window body made of a transparent material and arranged corresponding to the illuminating light.

13. The electric screwdriver according to claim 12, wherein the light shield is arranged between the exploring antenna and the handle housing.

14. The electric screwdriver according to claim 7, further comprising a first wire stripping member fixedly mounted to the handle housing and a second wire stripping member having a wire stripping position wherein the second wire stripping member is rotatably connected to the handle housing.

15. An electric screwdriver, comprising:
a motor having a motor shaft;
a handle housing for at least accommodating the motor;
an output shaft at least partly protruding from the handle housing, the output shaft defining an inserting groove, and a ratio of the maximum size of the handle housing to the maximum size of the inserting groove in a radial direction of the output shaft is greater than or equal to 3.9 and less than or equal to 8;
a transmission device for enabling the motor shaft to drive the output shaft to rotate around a first axis;
an exploring antenna for detecting whether an object is electrically charged; and
an operating switch coupled to the handle housing for controlling the motor.

16. The electric screwdriver according to claim 15, wherein the operating switch has an annular configuration surrounding the exterior of the handle housing.

17. The electric screwdriver according to claim 15, wherein the operating switch is arranged for rotation around the first axis relative to the handle housing.

18. The electric screwdriver according to claim 15, further comprising a testing button for controlling whether the exploring antenna is energized.

19. The electric screwdriver according to claim 15, further comprising an antenna shield arranged in front of the handle housing wherein the antenna shield comprises a joining portion for joining the antenna shield to the handle housing and a probe portion for accommodating the exploring antenna.

20. The electric screwdriver according to claim 19, wherein the joining portion surrounds the output shaft and the probe portion protrudes from the joining portion in an axial direction of the output shaft.

* * * * *